United States Patent
Rankin (12)

(10) Patent No.: US 6,448,778 B1
(45) Date of Patent: Sep. 10, 2002

(54) AUTOMATED VERIFICATION OF PROPER CONNECTIVITY OF COMPONENTS TO A WIRING HARNESS DURING ASSEMBLY OF ARTICLE OF MANUFACTURE

(75) Inventor: Brent C. Rankin, Lima, OH (US)

(73) Assignee: Honda of America Mfg., Inc., Marysville, OH (US)

( * ) Notice: Subject to any disclaimer, the term of this patent is extended or adjusted under 35 U.S.C. 154(b) by 0 days.

(21) Appl. No.: 09/772,407

(22) Filed: Jan. 29, 2001

(51) Int. Cl.[7] ............................................. H01R 4/00
(52) U.S. Cl. .................................................. 324/503
(58) Field of Search ............................... 324/503, 538

(56) References Cited

U.S. PATENT DOCUMENTS

| | | | |
|---|---|---|---|
| 4,337,515 A | 6/1982 | Kreft | 364/551 |
| 4,503,431 A | 3/1985 | Raab | 340/870.13 |
| 4,704,894 A | 11/1987 | Inuzuka et al. | 73/35 |
| 4,831,560 A * | 5/1989 | Zaleski | 701/33 |
| 5,231,357 A * | 7/1993 | Moody et al. | 29/593 |
| 5,408,471 A * | 4/1995 | Nobutoki et al. | 370/228 |
| 5,623,199 A * | 4/1997 | Taniguchi et al. | 324/538 |
| 5,661,453 A * | 8/1997 | Justus et al. | 340/438 |
| 5,798,647 A * | 8/1998 | Martin et al. | 324/503 |
| 6,009,360 A | 12/1999 | Knapp | 701/29 |
| 6,029,508 A | 2/2000 | Schoenbeck et al. | 73/116 |
| 6,220,874 B1 * | 4/2001 | Kurata et al. | 439/76.2 |
| 6,222,374 B1 * | 4/2001 | Shoemaker | 324/503 |
| 6,323,656 B2 * | 11/2001 | Shoemaker | 324/503 |
| 6,326,704 B1 * | 12/2001 | Breed et al. | 307/10.1 |
| 6,356,823 B1 * | 3/2002 | Iannotti et al. | 369/21 |

* cited by examiner

*Primary Examiner*—N. Le
*Assistant Examiner*—John Teresinski
(74) *Attorney, Agent, or Firm*—Monica H. Choi

(57) ABSTRACT

The present invention is an assembly line testing apparatus and method for automatically verifying proper connectivity of a plurality of components to a wiring harness within an article of manufacture, such as a vehicle engine, by electrically determining whether a closed circuit loop is formed with each component through two respective nodes of the wiring harness. A micro-controller controls application of a test voltage signal at a first node of the wiring harness to be coupled to one node of a component. The micro-controller then determines whether such a test voltage signal appears on a second node of the wiring harness to be coupled to the other node of the component to determine whether the component is properly connected to the wiring harness. In addition, the micro-controller determines and outputs an identification of any of the plurality of components that is not properly connected to the wiring harness. The present invention may be used to particular advantage for verifying proper connectivity of a plurality of engine components to the wiring harness within a vehicle engine during assembly of the vehicle engine.

27 Claims, 5 Drawing Sheets

AUTOMATED VERIFICATION OF PROPER CONNECTIVITY OF COMPONENTS TO A WIRING HARNESS DURING ASSEMBLY OF ARTICLE OF MANUFACTURE

TECHNICAL FIELD

The present invention relates to testing systems used during assembly of an article of manufacture, such as a vehicle engine, and more particularly to an apparatus and method for automatically verifying that a plurality of components are properly connected to a wiring harness during assembly of the article of manufacture.

BACKGROUND OF THE INVENTION

The present invention will be described for determining whether each of a plurality of engine components are properly connected to a wiring harness during manufacture of a vehicle engine. However, the present invention may be used for determining whether a plurality of components are properly connected to a wiring harness during manufacture of any type of article of manufacture, as would be apparent to one of ordinary skill in the art from the description herein.

Referring to FIG. 1, a wiring harness 12 includes a plurality of electrically conductive nodes (each electrically conductive node is represented as a black dot in FIG. 1). During manufacture of a vehicle engine, each electrically conductive node of the wiring harness 12 is coupled to an ECU (engine control unit) for coupling a plurality of engine components of the vehicle engine to the ECU (engine control unit), as known to one of ordinary skill in the art of automotive technology. The ECU (engine control unit) is a data processing device that controls the operation of the plurality of engine components for proper operation of the vehicle engine, as known to one of ordinary skill in the art of automotive technology.

Referring to FIG. 1, example engine components coupled to the wiring harness 12 are an ignition coil 14, a knock-sensor 16, and a linear solenoid 18. (A wiring harness typically has more numerous electrically conductive nodes than illustrated in FIG. 1, but fewer conductive nodes are illustrated in FIG. 1 for clarity of illustration and description. In addition, more numerous engine components are coupled to the wiring harness within a vehicle engine, but three example components 14, 16, and 18 are shown in FIG. 1 for clarity of illustration and description.)

Referring to FIG. 1, each of the plurality of components 14, 16, and 18 has two component nodes that are coupled to the wiring harness 12 with each component node being coupled to a respective node of the wiring harness 12. A first component node 24 of the ignition coil 14 is coupled to a respective first harness node 26 of the wiring harness 12 via a ground node 28. The ground node 28 within a vehicle is typically the chassis of the vehicle, as known to one of ordinary skill in the art of automotive technology. The first component node 24 of the ignition coil 14 is coupled to the ground node 28 which is in turn coupled to the respective first harness node 26 of the wiring harness 12. The ignition coil 14 has a second component node 20 that is coupled to a respective second harness node 22 of the wiring harness 12.

Similarly, a first component node 34 of the knock-sensor 16 is coupled to the respective first harness node 26 of the wiring harness 12 via the ground node 28. The first component node 34 of the knock-sensor 16 is coupled to the ground node 28 which is coupled to the respective first harness node 26 of the wiring harness 12. The knock-sensor 16 has a second component node 30 that is coupled to a respective second harness node 32 of the wiring harness 12.

Further referring to FIG. 1, the linear solenoid 18 has a first component node 36 that is coupled to a respective first harness node 38 of the wiring harness 12. A second component node 40 of the linear solenoid 18 is coupled to a respective second harness node 42 of the wiring harness 12.

During manufacture of the vehicle engine, an operator couples each of the components 14, 16, and 18 to the wiring harness 12. For coupling a component to the wiring harness 12, each of the first component node and the second component node of the component is connected to a respective node of the wiring harness 12 via a plug coupler, as known to one of ordinary skill in the art of automotive technology. For example, referring to FIG. 2, the first component node 36 of the linear solenoid 18 is connected to the respective first harness node 38 of the wiring harness 12 via a first plug coupler 44 (shown within dashed lines in FIG. 2), and the second component node 40 of the linear solenoid 18 is connected to the respective second harness node 42 of the wiring harness 12 via a second plug coupler 46 (shown within dashed lines in FIG. 2).

Referring to FIG. 2, for the first plug coupler 44, the first component node 36 of the linear solenoid 18 is connected to a male-half 48 of the first plug coupler 44, and the respective first harness node 38 of the wiring harness 12 is connected to a female-half 50 of the first plug coupler 44. Similarly, for the second plug coupler 46, the second component node 40 of the linear solenoid 18 is connected to a male-half 52 of the second plug coupler 46, and the respective second harness node 42 of the wiring harness 12 is connected to a female-half 54 of the second plug coupler 46.

The male-half 48 fits into the female-half 50 within the first plug coupler 44, and the male-half 52 fits into the female-half 54 within the second plug coupler 46. The vendor manufacturer of the linear solenoid 18 provides the linear solenoid component 18 with the male half 48 of the first plug coupler 44 connected to the first component node 36 of the linear solenoid 18 and with the male-half 52 of the second plug coupler 46 connected to the second component node 40 of the linear solenoid 18. In addition, the vendor manufacturer of the wiring harness 12 provides the wiring harness 12 with a respective female-half of a plug coupler connected to each of the nodes of the wiring harness.

During assembly of the vehicle engine, an operator manually fits each of the male-half of a plug coupler that is attached to a node of an engine component into a female-half of the plug coupler of a respective node of the wiring harness 12 to connect that node of the engine component to the respective node of the wiring harness 12. For example, referring to FIG. 2, the operator manually fits the male-half 48 into the female-half 50 within the first plug coupler 44 to connect the first component node 36 of the linear solenoid 18 to the respective first harness node 38 of the wiring harness 12. In addition, the operator manually fits the male-half 52 into the female-half 54 within the second plug coupler 46 to connect the second component node 40 of the linear solenoid 18 to the respective second harness node 42 of the wiring harness 12.

Referring to FIG. 3, during assembly of the vehicle engine, the operator fits together each of the respective male-half of a plug coupler connected to a node of each of the plurality of engine components to the respective female-half of the plug coupler connected to a corresponding node of the wiring harness 12. After such assembly of the plurality of engine components 60 to the wiring harness 12, the nodes of the wiring harness 12 are plugged into a wiring harness connector 62 of the ECU (engine control unit) 64 to provide connectivity of the ECU (engine control unit) 64 to the plurality of engine components via the nodes of the wiring harness 12.

The ECU (engine control unit) 64 is a data processing device that controls and monitors the operation of the plurality of engine components 60 for proper operation of the vehicle engine, as known to one of ordinary skill in the art of automotive technology. For example, for the ignition coil 14, the ECU (engine control unit) 64 causes an application of an ignition voltage pulse across the first component node 24 and the second component node 20 for ignition of spark plugs during operation of the vehicle engine, as known to one of ordinary skill in the art of automotive technology.

For the linear solenoid 18, the ECU (engine control unit) 64 adjusts the voltage level across the first component node 36 and the second component node 40 for shifting between various gears in an automatic vehicle transmission system during operation of the vehicle engine, as known to one of ordinary skill in the art of automotive technology. For the knock-sensor 16, the ECU (engine control unit) 64 monitors for a voltage at the second component node 30 to detect the occurrence of a spark-knock during operation of the vehicle engine, as known to one of ordinary skill in the art of automotive technology.

Engine components, such as the examples of the ignition coil 14, the knock-sensor 16, and the linear solenoid 18, that are coupled to the ECU (engine control unit) 64 are known to one of ordinary skill in the art of automotive technology. In addition, technology for the wiring harness 12 and the wiring harness connector 62 for providing connectivity of the ECU (engine control unit) 64 to the plurality of engine components 60 via nodes of the wiring harness 12 is known to one of ordinary skill in the art of automotive technology. In addition, technology for plug couplers, such as the example plug couplers 44 and 46, for providing connectivity of engine components to the wiring harness 12 is known to one of ordinary skill in the art of automotive technology.

During assembly of the vehicle engine, an assembly line operator by human error may not properly connect each of the engine components to the wiring harness 12. For example, the operator may by human error fit the male-half of a plug coupler only part-way into the female-half of the plug coupler such that the male-half of the plug coupler does not make electrical connection with the female-half of the plug coupler. Alternatively, the operator may by human error fit the male-half of a plug coupler into a female-half of a plug coupler for a wrong node of the wiring harness. Such human error by the operator results in improper connectivity of an engine component to the ECU (engine control unit) 64 such that the ECU (engine control unit) 64 cannot properly control such an engine component during operation of the vehicle engine.

Typically, during assembly of the vehicle engine, the engine is not run until a relatively long time after the engine components are assembled to the wiring harness 12 since many other components are also assembled into the vehicle engine before the engine may be run. Thus, improper connectivity of an engine component to the wiring harness 12 within the vehicle engine may not be noticed at or near the location for connecting the engine components to the wiring harness 12 when the engine is run. In addition, because the engine components are located in various parts of the vehicle engine, proper connectivity of the engine components to the wiring harness 12 cannot be visually inspected in an easy manner.

Thus, a mechanism is desired for automatically verifying proper connectivity of each of a plurality of engine components to the wiring harness 12 before the vehicle engine is completely assembled such that improper connectivity of any engine component to the wiring harness 12 is determined without the engine being run. In addition, a mechanism is desired for electrically verifying proper connectivity of each of a plurality of engine components to the wiring harness 12 such that visual inspection of the connections of the plurality of components to the wiring harness 12 is not necessary.

SUMMARY OF THE INVENTION

Accordingly, the present invention is an assembly line testing apparatus and method for automatically verifying proper connectivity of a plurality of components to a wiring harness within an article of manufacture, such as a vehicle engine, by electrically determining whether a closed circuit loop is formed with each component through two respective nodes of the wiring harness.

Each of the plurality of components has a respective first component node that is to be coupled to a respective first harness node of the wiring harness via a first respective plug coupler and has a respective second component node that is to be coupled to a respective second harness node of the wiring harness via a second respective plug coupler. In a general aspect of the present, a micro-controller controls application from a test voltage signal generator of a test voltage signal to the respective first harness node of the wiring harness. The micro-controller detects and inputs a resulting voltage signal at the respective second harness node of the wiring harness after application of the test voltage signal at the respective first harness node.

The resulting voltage signal is at a first voltage level if the respective first component node is properly connected to the respective first harness node of the wiring harness via the first respective plug coupler and if the respective second component node is properly connected to the respective second harness node of the wiring harness via the second respective plug coupler. On the other hand, the resulting voltage signal is at a second voltage level if the respective first component node is not properly connected to the respective first harness node of the wiring harness via the first respective plug coupler or if the respective second component node is not properly connected to the respective second harness node of the wiring harness via the second respective plug coupler.

The micro-controller determines that a component is properly connected to the wiring harness if the resulting voltage signal is at the first voltage level, and determines that the component is not properly connected to the wiring harness if the resulting voltage signal is at the second voltage level. The micro-controller determines whether a component is properly connected to the wiring harness in this manner for each of the plurality of components.

In another aspect of the present invention, a warning signal is provided if any of the components is not properly connected to the wiring harness, and an approval signal is provided if all of the components are properly connected to the wiring harness. In addition, the micro-controller determines an identification of any of the plurality of components that is not properly connected to the wiring harness as indicated by which harness node of the wiring harness has the second voltage level as the resulting voltage level. The identification of any of the plurality of components that is not properly connected to the wiring harness is displayed.

The present invention may be used to particular advantage for verifying proper connectivity of a plurality of engine components to the wiring harness within a vehicle engine during assembly of the vehicle engine.

In this manner, the assembly line testing apparatus and method of the present invention verifies proper connectivity of a plurality of components to a wiring harness, apart from operation of the article of manufacture being tested. Thus, proper connectivity of the components to the wiring harness may be determined during assembly of the article of manufacture before the article of manufacture is completely assembled. In addition, the assembly line testing apparatus and method of the present invention determines proper connectivity of the plurality of components to the wiring harness electrically such that visual inspection of the connection of each of the plurality of components is not necessary.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, and 7 refer to elements having similar structure and function.

DETAILED DESCRIPTION

The present invention is described for determining whether each of a plurality of engine components are properly connected to a wiring harness during manufacture of a vehicle engine. However, the present invention may be used for determining whether a plurality of components are properly connected to a wiring harness during manufacture of any type of article of manufacture, as would be apparent to one of ordinary skill in the art from the description herein.

Figure 4:
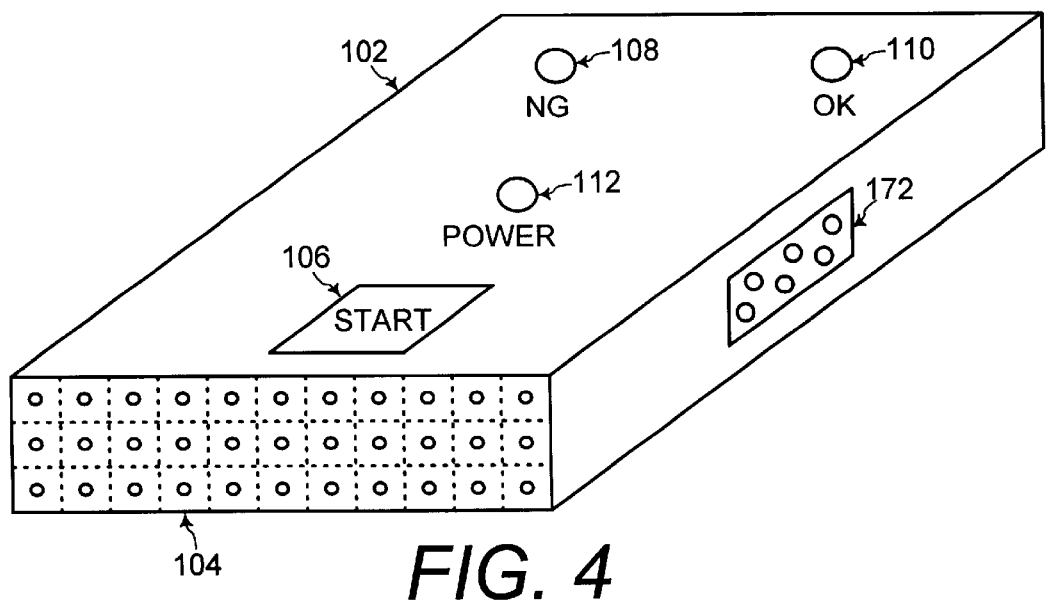
FIG. 4 shows a portable unit for housing the components of the assembly line testing apparatus of the present invention for electrically verifying proper connectivity of the plurality of engine components to the wiring harness during manufacture of a vehicle engine, according embodiment of the present invention.
Figure 5:
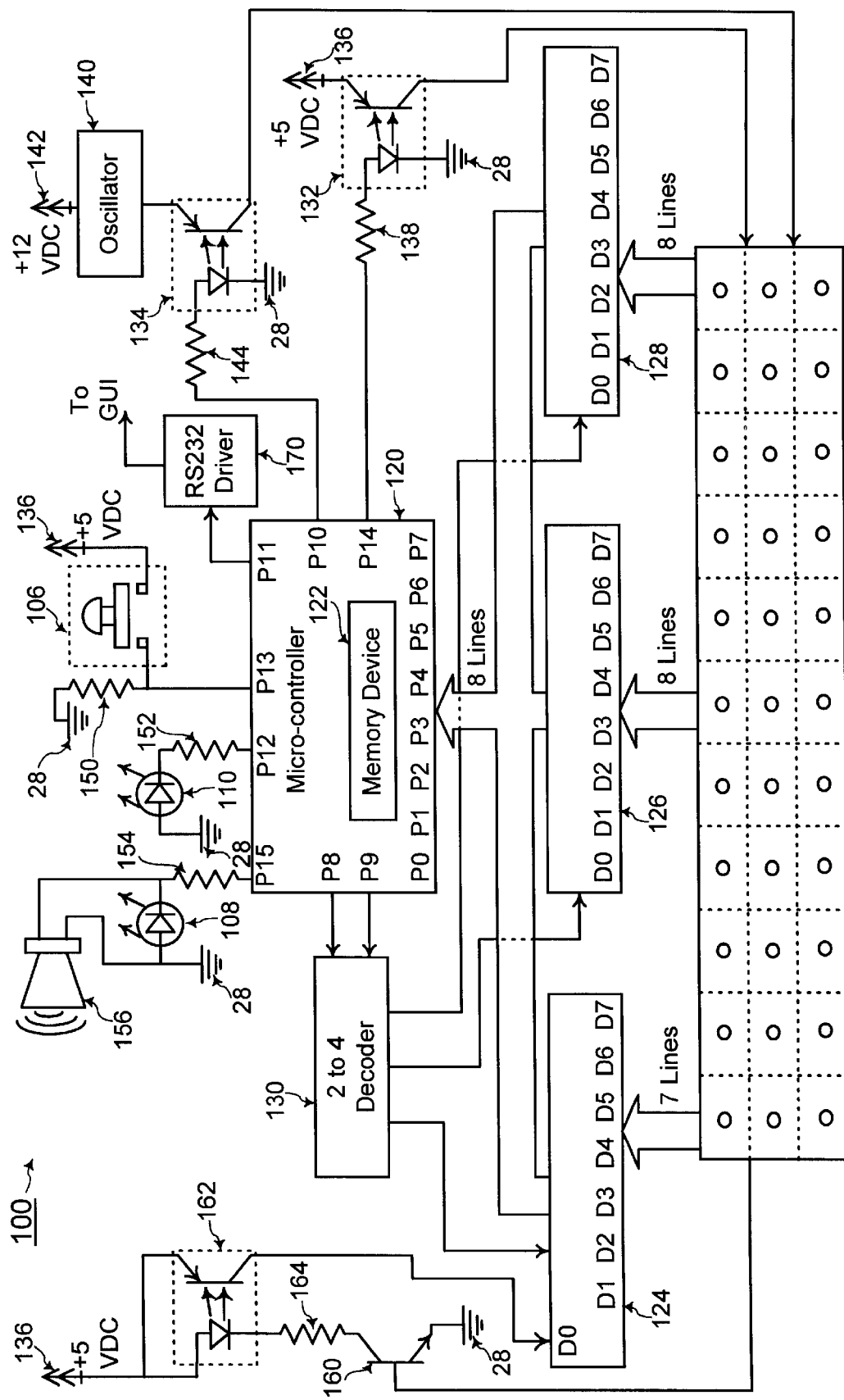
FIG. 5 shows the components of the assembly line testing apparatus of the present invention for electrically verifying proper connectivity of the plurality of engine components to the wiring harness during manufacture of the vehicle engine, according to an embodiment present invention.

Referring to FIGS. 4 and 5, a housing unit 102 carries the components of an assembly line testing apparatus 100 for electrically verifying proper connectivity of a plurality of engine components to a wiring harness. The housing unit 102 may include a battery for providing power to the assembly line testing apparatus 100 such that the assembly line testing apparatus 100 within the housing unit 102 is portable.

Figure 3:
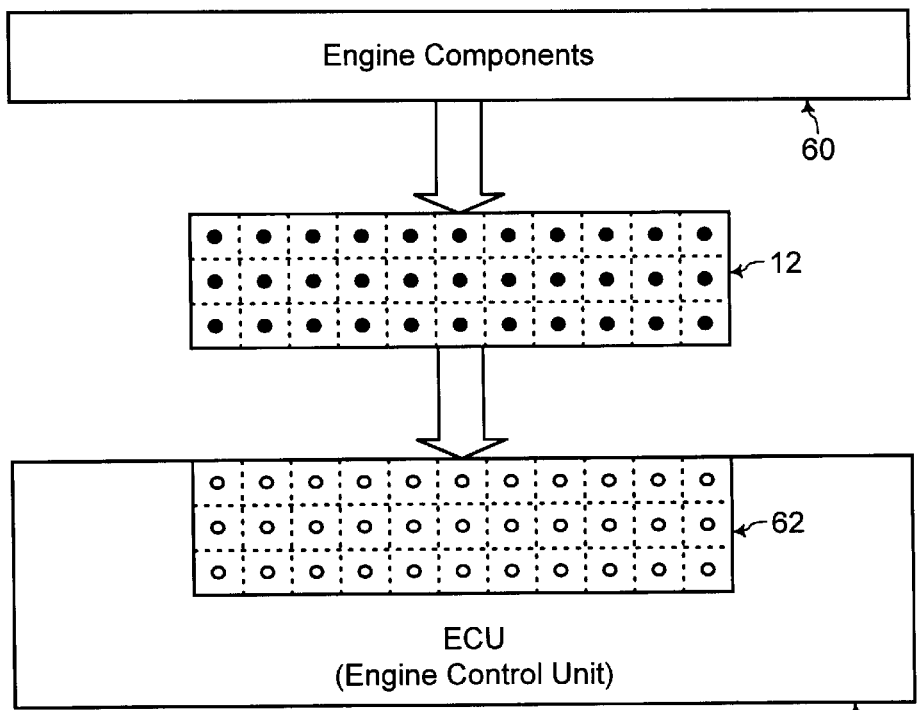
FIG. 3 illustrates coupling the wiring harness to a wiring harness connector of an ECU (engine control unit) for providing connectivity of the ECU (engine control unit) to the plurality of engine components, as known in the prior art.

Referring to FIGS. 3, 4, and 5, the apparatus 100 includes a testing harness connector 104 which is similar to the wiring harness connector 62 of the ECU (engine control unit) 64 as known to one of ordinary skill in the art of automotive technology. The wiring harness 12 of the vehicle engine plugs into the testing harness connector 104 during testing for proper connectivity of the plurality of engine components to the wiring harness 12.

Referring to FIGS. 4 and 5, the housing unit 102 has a start button 106 such that the operator may depress the start button 106 on the housing unit 102. The housing unit 102 also includes a "NG" LED ("No Good" light emitting diode) 108, an OK LED (light emitting diode) 110, and a power LED (light emitting diode) 112. The power LED 112 is turned on (to be lighted) when a power source (such as a battery within the housing unit 102 for example) is sufficient for proper operation of the assembly line testing apparatus 100 or is turned off to indicate that the power source is insufficient for proper operation of the assembly line testing apparatus 100.

Referring to FIG. 5, the assembly line testing apparatus 100 further includes a micro-controller 120 for controlling the operation of the assembly line testing apparatus 100. The micro-controller 120 includes a memory device 122 having sequences of instructions stored thereon. The micro-controller 120 executes the sequences of instructions stored in the memory device 122. Such instructions may be programmed into the memory device 122 of the micro-controller in a manner known to one of ordinary skill in the art of micro-controllers. Execution of such sequences of instructions causes the micro-controller 120 to perform the steps of an embodiment of the present invention as described herein.

Referring to FIG. 5, the nodes of the testing harness connector 104 mirror the nodes of the wiring harness 12 to provide connectivity to the nodes of the wiring harness 12 when the wiring harness 12 is plugged into the testing harness connector 104. Nodes of the testing harness connector 104 and in turn of the wiring harness 12 are coupled to the micro-controller 120 when the wiring harness 12 is plugged into the testing harness connector 104.

Each node of the testing harness connector 104, to be connected to a corresponding one node of each of the plurality of engine components, is coupled to the micro-controller 120 via one of a first bus interface driver 124, a second bus interface driver 126, or a third bus interface driver 128. Each such node of the testing harness connector 104 is connected to a respective one line (D0, D1, D2, D3, D4, D5, D6, or D7) of one of the first, second, and third bus interface drivers 124, 126, and 128.

Each of the first, second, and third bus interface drivers 124, 126, and 128 has eight lines (D0, D1, D2, D3, D4, D5, D6, and D7) that are coupled to eight input lines (P0, P1, P2, P3, P4, P5, P6 and P7) of the micro-controller 120. Thus, the three D0 lines of the first, second, and third bus interface drivers 124, 126, and 128 are coupled together to the P0 line of the micro-controller 120. The three D1 lines of the first, second, and third bus interface drivers 124, 126, and 128 are coupled together to the P1 line of the micro-controller 120. The three D2 lines of the first, second, and third bus interface drivers 124, 126, and 128 are coupled together to the P2 line of the micro-controller 120. The three D3 lines of the first, second, and third bus interface drivers 124, 126, and 128 are coupled together to the P3 line of the micro-controller 120. The three D4 lines of the first, second, and third bus interface drivers 124, 126, and 128 are coupled together to the P4 line of the micro-controller 120. The three D5 lines of the first, second, and third bus interface drivers 124, 126, and 128 are coupled together to the P5 line of the microcontroller 120. The three D6 lines of the first, second, and third bus interface drivers 124, 126, and 128 are coupled together to the P6 line of the micro-controller 120. The three D7 lines of the first, second, and third bus interface drivers 124, 126, and 128 are coupled together to the P7 line of the micro-controller 120.

A 2-to-4 decoder 130 is coupled between control lines P8 and P9 of the micro-controller 120 and the first, second, and third bus interface drivers 124, 126, and 128. The micro-controller 120 enables, via the 2-to-4 decoder, the signals on the eight lines D0, D1, D2, D3, D4, D5, D6, and D7 from a selected one of the first, second, and third bus interface drivers 124, 126, and 128 to be gated to the eight input lines P0, P1, P2, P3, P4, P5, P6, and P7 of the micro-controller 120.

Whereas a node of the testing harness connector 104 corresponding to one node of an engine component is connected to a respective line (D0, D1, D2, D3, D4, D5, D6, or D7) of one of the first, second, and third bus interface drivers 124, 126, and 128, the other node of the testing harness connector 104 corresponding to the other node of the engine component is coupled to a test voltage signal generator including a first opto-isolator device 132 and a second opto-isolator device 134. Such a node of the testing harness connector 104 is coupled to a ±5 Volt DC (direct current) power supply 136 via the first opto-isolator device 132. Power supplies such as voltage regulators for providing the +5 Volt DC (direct current) signal are known to one of ordinary skill in the art of electronics.

A control line P14 of the micro-controller 120 is coupled to the input of the first opto-isolator device 132. A resistor 138 is coupled between the control line P14 of the micro-controller 120 and the first opto-isolator device 132 to limit the current flowing through the first opto-isolator device 132 and the control line P14 of the micro-controller 120. The first opto-isolator device 132 allows an optical coupling of the micro-controller 120 to the +5 Volt DC (direct current) power supply 136 while electrically isolating any potentially high voltage at the +5 Volt DC (direct current) power supply 136 from the micro-controller 120 to prevent damage to the micro-controller 120.

A node of the testing harness connector 104 corresponding to one node of an engine component is connected to a respective line (D0, D1, D2, D3, D4, D5, D6, or D7) of one of the first, second, and third bus interface drivers 124, 126, and 128. The other node of the testing harness connector 104 corresponding to the other node of the engine component is coupled to the +5 Volt DC (direct current) power supply 136 via the first opto-isolator device 132 when the voltage on the control line P14 of the micro-controller 120 turns on the first opto-isolator device 132.

Referring to FIG. 5, a node of the testing harness connector 104 coupled to one node 34 of the knock-sensor 16 is coupled to an oscillator 140 via the second opto-isolator device 132. Because the knock-sensor 16 is a piezo-transducer device that is substantially capacitive, as known to one of ordinary skill in the art of automotive technology, the oscillator 140 generates an AC (alternating current) voltage test signal to be applied on the node 34 of the knock-sensor 16.

The oscillator 140 is coupled to a +12 Volt DC (direct current) power supply 142, and the oscillator 140 is tuned to provide an AC (alternating current) voltage test signal having the resonance frequency of the knock-sensor 16. Technology for such an oscillator 140 which may be tuned to provide an AC (alternating current) voltage test signal having the resonance frequency of the knock-sensor 16 is known to one of ordinary skill in the art of automotive technology.

A control line P10 of the micro-controller 120 is coupled to the input of the second opto-isolator device 134. A resistor 144 is coupled between the control line P10 of the micro-controller 120 and the second opto-isolator device 134 to limit the current flowing through the second opto-isolator device 134 and the control line P10 of the micro-controller 120. The second opto-isolator device 134 allows an optical coupling of the micro-controller 120 to the oscillator 140 while electrically isolating any potentially high voltage at the oscillator 140 from the micro-controller 120 to prevent damage to the micro-controller 120. A node of the testing harness connector 104 coupled to the node 34 of the knock-sensor 16 is coupled to the oscillator 140 via the second opto-isolator device 132 when the voltage on the control line P10 of the micro-controller 120 turns on the second opto-isolator device 134.

A control line P13 of the micro-controller 120 is coupled to the ground node 28 via a resistor 150 and to one node of the start button 106. The other node of the start button 106 is coupled to the +5 Volt DC (direct current) power supply 136. When the start button 106 is not depressed, the control line P13 of the micro-controller 120 has 0 Volts of the ground node 28 applied thereon. On the other hand, when the start button 106 is depressed, the control line P13 of the micro-controller 120 has +5 Volts of the +5 Volt DC (direct current) power supply 136 applied thereon.

A control line P12 of the micro-controller 120 is coupled to the OK LED 110 via a resistor 152. The OK LED 110 is controlled to be turned off or turned on by a voltage level on the control line P12 of the micro-controller 120. The resistor 150 between the OK LED 110 and the control line P12 of the micro-controller 120 limits the current level through the OK LED 110 and through the control line P12 of the micro-controller 120.

A control line P15 of the micro-controller 120 is coupled to the NG LED 108 via a resistor 154. The NG LED 108 is controlled to be turned off or turned on by a voltage level on the control line P15 of the micro-controller 120. The resistor 154 between the NG LED 108 and the control line P15 of the micro-controller 120 limits the current level through the NG LED 108 and through the control line P15 of the micro-controller 120. In addition, the control line P15 of the micro-controller 120 is coupled to an audible alarm 156 via the resistor 154. The audible alarm 156 is controlled to be turned off or turned on by a voltage level on the control line P15 of the micro-controller 120.

Referring to FIG. 5, the node of the testing harness connector 104 connected to one node 34 of the knock-sensor 16 is coupled to the oscillator 140 via the second opto-isolator device 132. Another node of the testing harness connector 104 connected to the other node 30 of the knock-sensor 16 is coupled to the base of a BJT (bipolar junction transistor) 160. The emitter of the BJT (bipolar junction transistor) 160 is coupled to the ground node 28, and the collector of the BJT (bipolar junction transistor) 160 is coupled to a third opto-isolator device 162 via a resistor 164. The third opto-isolator device 162 couples the +5 Volt DC (direct current) power supply 136 to a line D0 of the first bus interface driver 124 when the third opto-isolator device 162 is turned on by current flowing through the BJT (bipolar junction transistor) 160.

Figure 6:
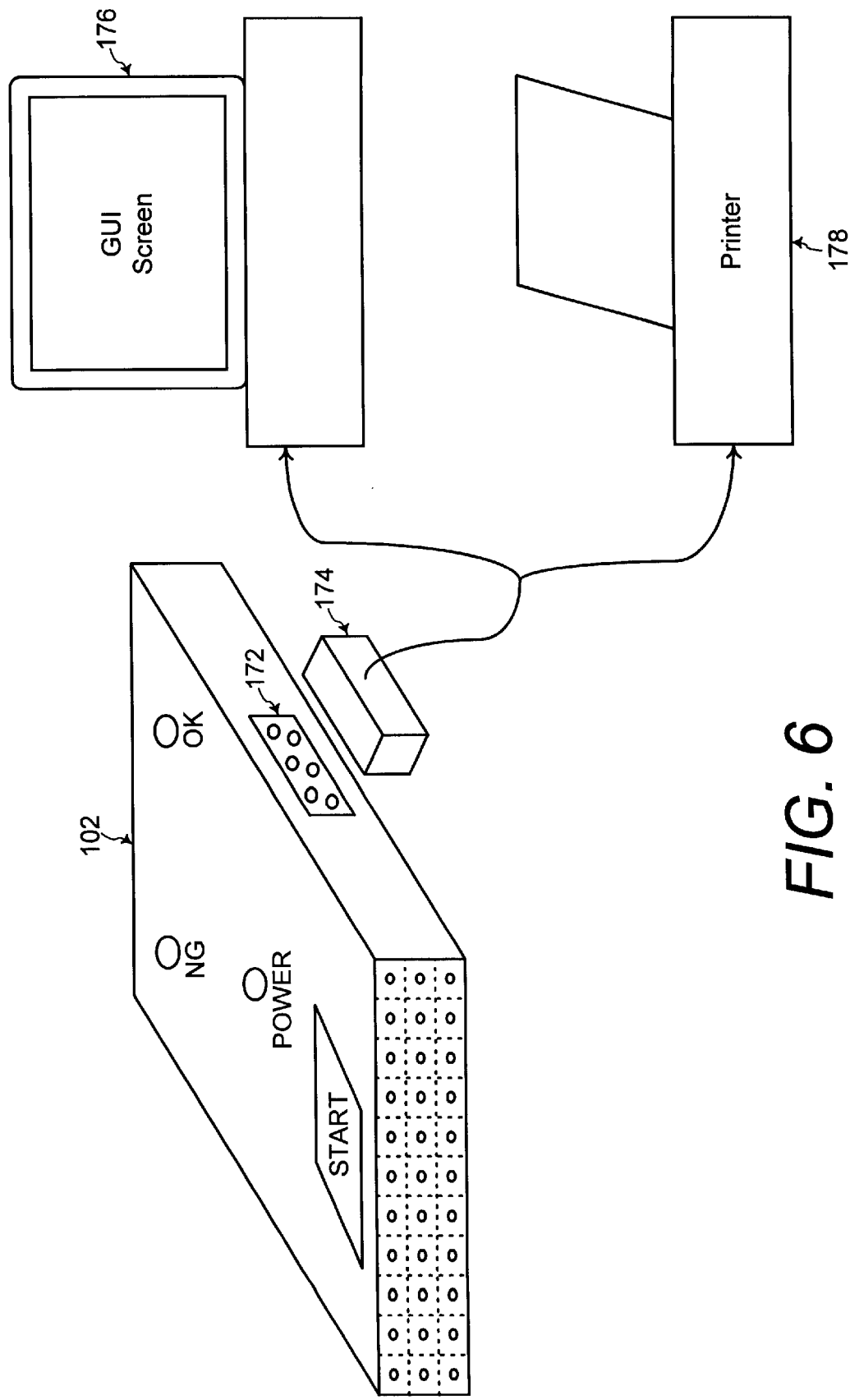
FIG. 6 illustrates coupling the assembly line testing apparatus of FIGS. 4 and 5 to a GUI (graphical user interface) screen or a printer for displaying identification of any of the engine components that is not properly connected to the wiring harness, according to an embodiment of the present invention.

Further referring to FIG. 5, a control line P11 of the micro-controller 120 is coupled to a RS232 driver 170. The RS232 driver 170 converts the +5 Volt level output from the control line P11 of the micro-controller 120 to a higher voltage level required for RS232 communications format, and such an RS232 driver is known to one of ordinary skill in the art of electronics. Referring to FIGS. 5 and 6, the RS232 driver 170 is coupled to an output port 172 of the housing unit 102. An interface 174 from a GUI (graphical user interface) screen 176 or from a printer 178 plugs into the output port 172 of the housing unit 102. Such an interface 174 is known to one of ordinary skill in the art of electronics.

The GUI (graphical user interface) screen 176 may be part of a PC (personal computer) system as known to one of ordinary skill in the art of electronics for displaying text in ASCII format, and the printer 178 may be any type known to one of ordinary skill in the art of electronics for printing text in ASCII format. The RS232 driver 170 converts the output voltage from the control line P11 of the micro-controller 120 to a RS232 voltage level format such that the text may be displayed on the GUI (graphical user interface) screen 176 or printed on the printer 178.

Technology for each of the individual components in FIG. 5, such as the micro-controller 120, the bus interface drivers 124, 126, 128, the 2-to-4 decoder 130, the opto-isolator devices 132, 134, and 162, the oscillator 140, and the RS232 driver 170, is known to one of ordinary skill in the art of electronics. A detailed description of the operation of the assembly line testing apparatus 100 of the present invention is now described with reference to the flowchart of FIG. 7.

Figure 7:
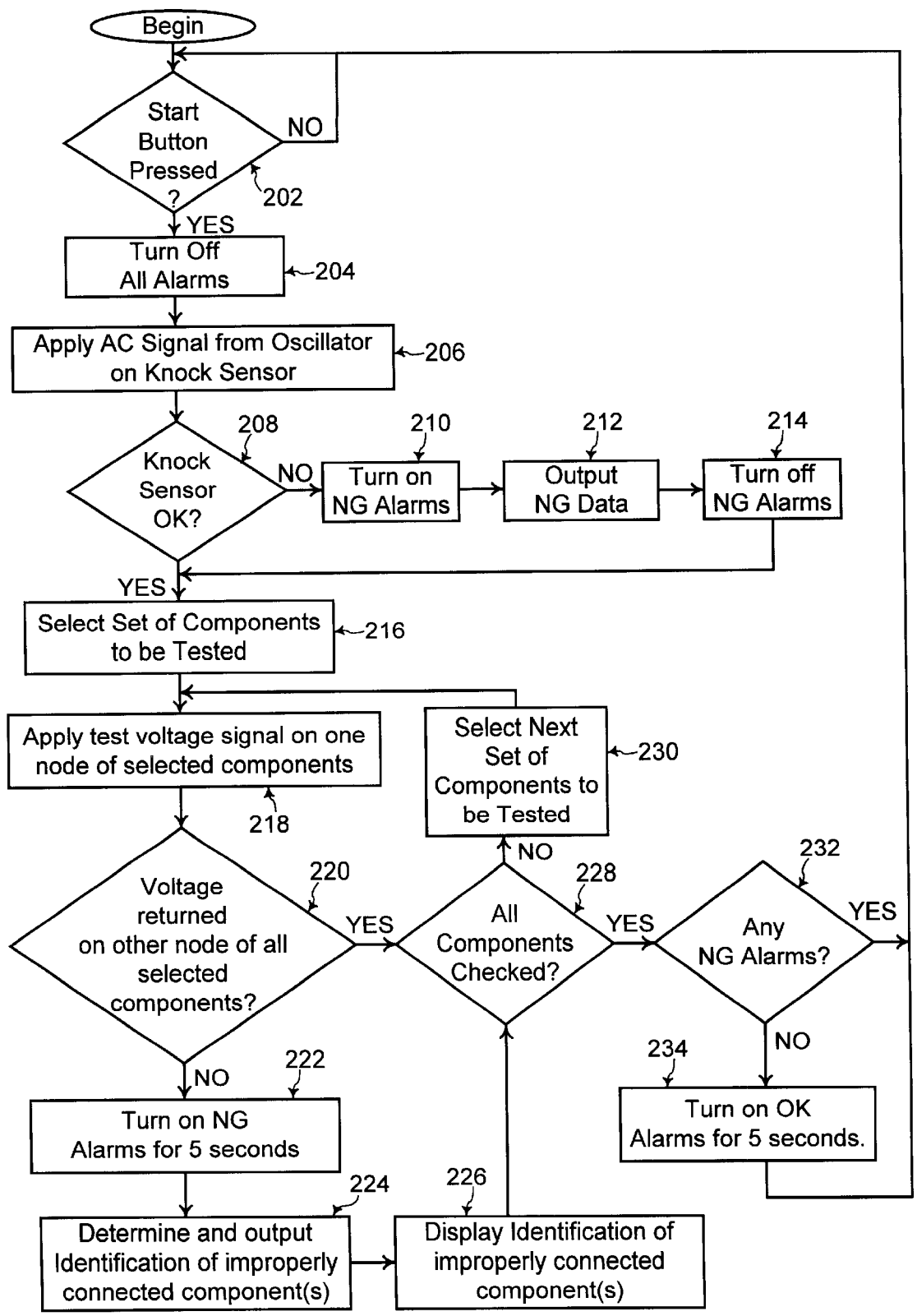
FIG. 7 shows a flowchart with steps of operation of the assembly line testing apparatus of FIGS. 4, 5, and 6 for electrically verifying proper connectivity of the plurality of engine components to the wiring harness during manufacture of the vehicle engine, according to an embodiment of the present invention.

Referring to FIGS. 5 and 7, the micro-controller 120 controls the operation of the assembly line testing apparatus 100. FIG. 7 shows the flowchart of the software having the sequences of instruction stored in the memory device 122 and executed by the micro-controller 120 for controlling the operation of the assembly line testing apparatus 100. The micro-controller 120 may be any type of programmable data processing device as known to one of ordinary skill in the art, such as PLD's (Programmable Logic Devices) or any other type of such data processors. The micro-controller 120 is programmed with storage of the sequences of instructions stored in the memory device 122 to operate in accordance with the flowchart of FIG. 7.

Figure 1:
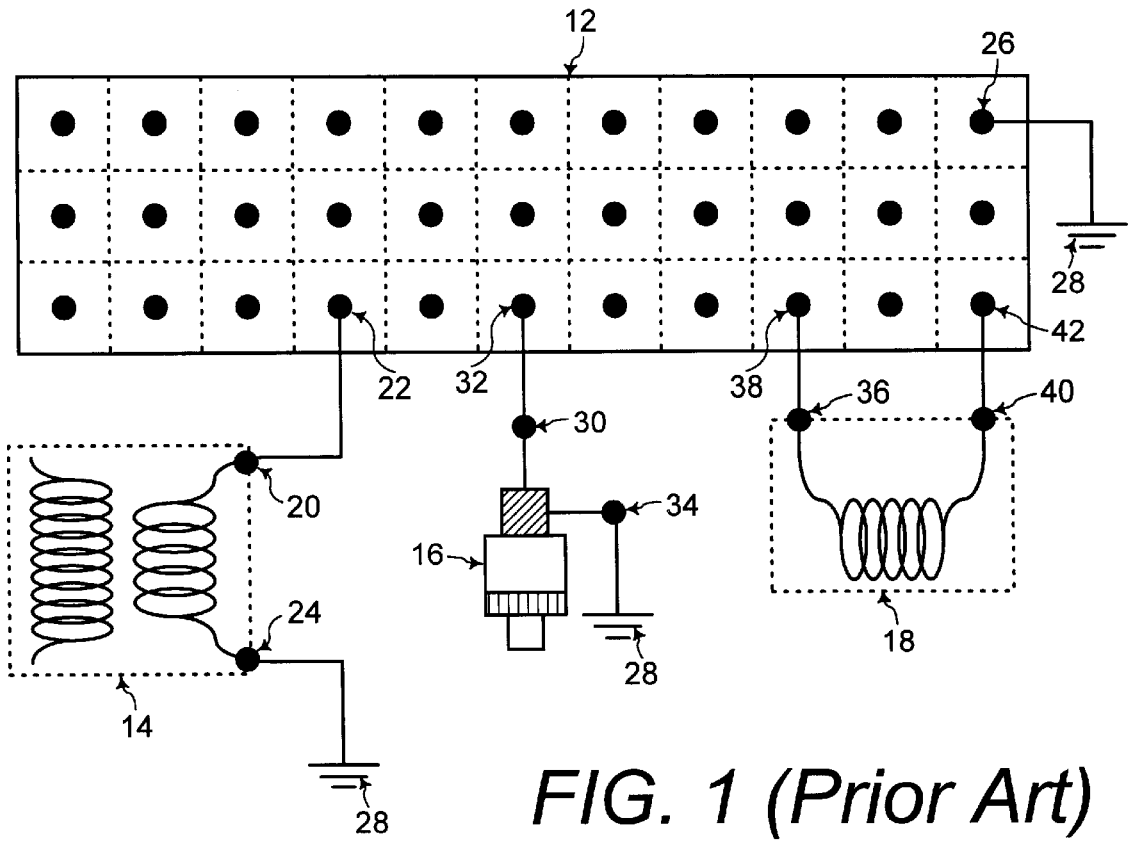
FIG. 1 shows example engine components coupled to respective nodes of a wiring harness of a vehicle engine, as known in the prior art.
Figure 2:
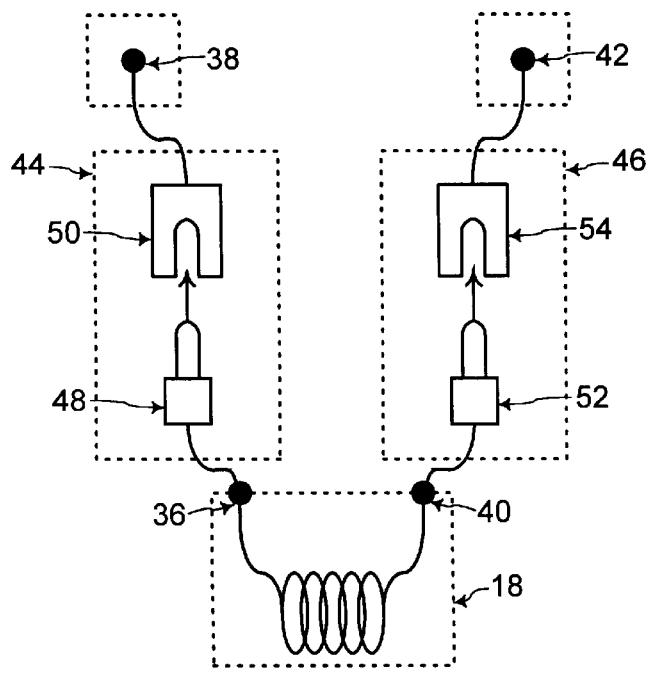
FIG. 2 shows plug couplers for connecting nodes of an example engine component to respective nodes of the wiring harness of FIG. 1, as known in the prior art.

Referring to FIGS. 1 and 4, for verifying proper connection of a plurality of engine components to the wiring harness 12, an assembly line operator plugs the wiring harness 12 into the testing harness connector 104 on the housing unit 102. Referring to FIGS. 4, 5 and 7, the start button 106 is depressed by the operator (step 202 of FIG. 7) to indicate to the micro-controller 120 that the wiring harness 12 has been plugged into the testing harness connector 104 such that verification of proper connectivity of the plurality of engine components to the wiring harness 12 may begin. Referring to FIG. 5, when the start button 106 is not depressed, 0 Volts of the ground node 28 is applied to the control line P13 of the micro-controller 120 indicating to the micro-controller 120 that the start button 106 is not depressed. When the start button 106 is depressed, the +5 Volts of the power supply 136 is applied on the control line P13 of the micro-controller 120 indicating to the micro-controller 120 that the start button 106 has been depressed.

Referring to FIGS. 5 and 7, the micro-controller 120 loops to wait until the operator depresses the start button 106. When the operator has plugged the wiring harness 12 into the testing harness connector 104 and has pressed the start button 106, the micro-controller 120 turns off all alarms by applying substantially 0 Volts on control lines P12 and P13 of the micro-controller 120 (step 204 of FIG. 7). Application of 0 Volts on control lines P12 and P13 by the micro-controller 120 causes the OK LED 110 and the NG LED 108 to be turned off to be not lighted and causes the audible alarm 156 to be turned off to not emit any audible signal. In addition, application of 0 Volts on control lines P10 and P14 by the micro-controller 120 causes the first opto-isolator device 132 and the second opto-isolator device 134 to be turned off.

Referring to FIGS. 1, 5, and 7, according to one embodiment of the present invention, the assembly line testing apparatus 100 first verifies the proper connectivity of the knock-sensor 16 (steps 206 and 208 of FIG. 7). A node of the testing harness connector 104 (corresponding to the first harness node 26 of the wiring harness 12) is to be connected to the first component node 34 of the knock-sensor 16. Such a node of the testing harness connector 104 is coupled to the oscillator 140 via the second opto-isolator device 132.

The micro-controller 120 applies +5 Volts on the control line P10 to turn on the second opto-isolator device 134 to couple the oscillator 140 to the first component node 34 of the knock-sensor 16. In this manner, if the first component node 34 of the knock-sensor 16 has been properly connected to the first harness node 26 of the wiring harness 12, the AC (alternating current) test voltage signal from the oscillator 140 is applied on the first component node 34 of the knock-sensor 16 (step 206 of FIG. 7). An AC (alternating current) test voltage signal (instead of a DC (direct current) voltage signal) is applied through the knock-sensor 16 because the knock-sensor is substantially capacitive.

Another node of the testing harness connector 104 (corresponding to the second harness node 32 of the wiring harness) is to be connected to the other node 30 of the knock-sensor 16. Such a node of the testing harness connector 104 is coupled to the base of the BJT (bipolar junction transistor) 160. Referring to FIGS. 1 and 5, if the first component node 34 of the knock-sensor 16 has been properly connected to the first harness node 26 of the wiring harness 12 and if the second component node 30 has been properly connected to the second harness node 32 of the wiring harness 12, then the AC (alternating current) test voltage signal from the oscillator 140 flows through the knock sensor 16 from the first component node 34 to the second component node 30 of the knock-sensor 16.

When the AC (alternating current) test voltage signal appears on the second harness node 32 of the wiring harness 12 that is coupled to the base of the BJT (bipolar junction transistor) 160, the BJT (bipolar junction transistor) 160 turns on to also turn on the third opto-isolator device 162. When the third opto-isolator device 162 is turned on, the D0 line of the first bus interface driver 124 is coupled to the +5

Volt DC (direct current) power supply 136 such that a first voltage level of +5 Volts is applied on the D0 line of the first bus interface driver 124.

Alternatively, if the first component node 34 of the knock-sensor 16 has not been properly connected to the first harness node 26 of the wiring harness 12 or if the second component node 30 has not been properly connected to the second harness node 32 of the wiring harness 12, then the AC (alternating current) test voltage signal from the oscillator 140 does not flows through the knock sensor 16 from the first harness node 26 to the second harness node 32. Thus, the AC (alternating current) test voltage signal from the oscillator 140 does not appear on the second harness node 32 of the wiring harness 12 that is coupled to the base of the BJT (bipolar junction transistor) 160. In that case, the BJT (bipolar junction transistor) 160 does not turn on and the third opto-isolator device 162 does not turn on such that the D0 line of the first bus interface driver 124 is not coupled to the +5 Volt DC (direct current) power supply 136. Thus, a second voltage level of 0 Volts is applied on the D0 line of the first bus interface driver 124.

The micro-controller 120 applies 0 Volts on the control line P8 and +5 Volts on the control line P9 such that the 2-to-4 decoder enables the signals on the eight lines D0, D1, D2, D3, D4, D5, D6, and D7 from the first bus interface driver 124 to be gated to the eight input lines P0, P1, P2, P3, P4, P5, P6, and P7 of the micro-controller 120. With application of 0 Volts on the control line P8 and +5 Volts on the control line P9 by the micro-controller 120, the second bus interface driver 126 and the third bus interface driver 128 are disabled in a manner known to one of ordinary skill in the art of electronics.

The micro-controller 120 inputs the resulting voltage level on the line D0 of the first bus interface driver 124 to determine whether the knock-sensor 16 has been properly connected to the wiring harness 12 (step 208 of FIG. 7). If the voltage on the line D0 of the first bus interface driver 124 is at the first voltage level of +5 Volts, the micro-controller 120 determines that the first component node 34 of the knock-sensor 16 has been properly connected to the first harness node 26 of the wiring harness 12 and that the second component node 30 has been properly connected to the second harness node 32 of the wiring harness 12.

On the other hand, if the voltage on the line D0 of the first bus interface driver 124 is at the second voltage level of 0 Volts, the micro-controller 120 determines that the first component node 34 of the knock-sensor 16 has not been properly connected to the first harness node 26 of the wiring harness 12 or that the second component node 30 has not been properly connected to the second harness node 32 of the wiring harness 12. For example, a component node of the knock-sensor 16 may not be properly connected to the respective harness node of the wiring harness 12 because the male-half of the respective plug coupler may be insufficiently inserted into the female-half of the respective plug coupler. Alternatively, a component node of the knock-sensor 16 may not be properly connected to the respective harness node of the wiring harness 12 because the male-half of the respective plug coupler may be inserted into a female-half of a plug coupler corresponding to a wrong node of the wiring harness 12.

If the micro-controller 120 determines that the knock-sensor 16 is improperly connected to the wiring harness 12 because the voltage on the line D0 of the first bus interface driver 124 is at the second voltage level of 0 Volts, then the micro-controller 120 applies +5 Volts on the control line P15 to turn on the NG LED 108 and to turn on the audible alarm 156 (step 210 of FIG. 7). Such visual and audible alarms provide a warning signal to the operator that a component of the plurality of components is not properly connected to the wiring harness 12.

In addition, the micro-controller 120 outputs data including the identification (i.e., the knock-sensor 16) of the component that is not properly connected to the wiring harness 12 via control line P11 (step 212 of FIG. 7). Referring to FIGS. 5 and 6, such identification data is converted to text in ASCII format by the micro-controller. Such text in ASCII format with identification of the component that is not properly connected to the wiring harness 12 is displayed on the GUI (graphical user interface) screen 176 or printed on the printer 178. The operator, upon such notification that the knock-sensor 16 is not properly connected to the wiring harness 12, may take measures to properly reconnect the knock-sensor 16 to the wiring harness 12. The micro-controller 120 applies 0 Volts on the control line P15 to turn off the NG LED 108 and the audible alarm 156 (step 214 of FIG. 7).

Referring to FIG. 7, after the micro-controller 120 determines whether the knock-sensor 16 is properly connected to the wiring harness 12 (step 208 of FIG. 7), the micro-controller 120 verifies the proper connectivity of the rest of the plurality of engine components to the wiring harness 12. A node of the testing harness connector 104, to be connected to one node of an engine component, is coupled to a respective line (D0, D1, D2, D3, D4, D5, D6, or D7) of one of the first, second, and third bus interface drivers 124, 126, and 128. Thus, each of the first, second, and third bus interface drivers 124, 126, and 128 is assigned to be coupled to a respective set of the plurality of engine components. The micro-controller 120 selects one of such a set of the plurality of engine components for verifying proper connectivity of such a set of engine components (step 216 of FIG. 7).

For example, the micro-controller 120 applies 0 Volts on the control line P8 and +5 Volts on the control line P9 to select the set of engine components assigned to be coupled to the first bus interface driver 124. Application of 0 Volts on the control line P8 and +5 Volts on the control line P9 causes the 2-to-4 decoder 130 to enable the signals on the eight lines D0, D1, D2, D3, D4, D5, D6, and D7 from the first bus interface driver 124 to be gated to the eight input lines P0, P1, P2, P3, P4, P5, P6, and P7 of the micro-controller 120 while the second and third bus interface drivers 126 and 128 are disabled.

In addition, the micro-controller 120 applies +5 Volts on the control line P14 to turn on the first opto-isolator device 132 to couple the +5 Volt DC (direct current) power supply 136 to each of the respective harness node corresponding to the set of engine components assigned to be coupled to the first bus interface driver 124 (step 218 of FIG. 7). For example, referring to FIG. 1, assume that the second component node 20 of the ignition coil 14 is to be coupled to one of the lines D1, D2, D3, D4, D5, D6, and D7 of the first bus interface driver 124 via the respective harness node 22. The first component node 24 of the ignition coil 14 is to be coupled to the +5 Volt DC (direct current) power supply 136 via the respective harness node 26 when the micro-controller 120 turns on the first opto-isolator device 132.

If an engine component assigned to be coupled to the first bus interface driver 124 is properly connected to the wiring harness 12, the +5 V test voltage signal travels through such a component, and a first voltage level of +5 V appears on one of the lines D1, D2, D3, D4, D5, D6, and D7 of the first bus interface driver 124 coupled to such a component. For example, referring to FIG. 1, if the first component node 24 of the ignition coil 14 is properly connected to the respective harness node 26 and if the second component node 20 is properly connected to the respective harness node 22, when the +5 Volt DC (direct current) power supply 136 is coupled to the first component node 24 of the ignition coil 14 via the respective harness node 26, the first voltage level of +5 Volts appears on the respective harness node 22 via the second component node 20 of the ignition coil 14. In that case, one of the lines D1, D2, D3, D4, D5, D6, and D7 of the first bus interface driver 124 coupled to the node of the testing harness connector corresponding to the respective harness node 22 has the first voltage level of +5 Volts thereon.

On the other hand, if a component is not properly connected to the wiring harness 12, then a second voltage level of 0 Volts appears on one of the lines D1, D2, D3, D4, D5, D6, and D7 of the first bus interface driver 124 coupled to such a component. For example, referring to FIG. 1, if the first component node 24 of the ignition coil 14 is not properly connected to the respective harness node 26 or if the second component node 20 is not properly connected to the respective harness node 22, when the +5 Volt DC (direct current) power supply 136 is coupled to the respective harness node 26, the second voltage level of 0 Volts appears on the respective harness node 22. In that case, one of the lines D1, D2, D3, D4, D5, D6, and D7 of the first bus interface driver 124 coupled to the respective harness node 22 has the second voltage level of 0 Volts thereon.

The micro-controller 120 inputs the respective resulting voltage level on each of the lines D1, D2, D3, D4, D5, D6, and D7 of the first bus interface driver 124 to determine whether each of the set of engine components assigned to the first bus interface driver 124 has been properly connected to the wiring harness 12 (step 220 of FIG. 7). If the voltage on each of the lines D1, D2, D3, D4, D5, D6, and D7 of the first bus interface driver 124 is at the first voltage level of +5 Volts, the micro-controller 120 determines that each of the set of engine components assigned to the first bus interface driver 124 has been properly connected to the wiring harness 12.

On the other hand, if the voltage on any of the lines D1, D2, D3, D4, D5, D6, and D7 of the first bus interface driver 124 is at the second voltage level of 0 Volts, the micro-controller 120 determines that a component of the set of engine components assigned to be coupled to the first bus interface driver 124 has not been properly connected to the wiring harness 12. In that case, the micro-controller 120 applies +5 Volts on the control line P15 to turn on the NG LED 108 and to turn on the audible alarm 156 for about 5 seconds (step 222 of FIG. 7). Such visual and audible alarms provide a warning signal to the operator that a component of the plurality of components is not properly connected to the wiring harness 12.

In addition, the micro-controller 120 determines and outputs data including the identification of the component that is not properly connected to the wiring harness 12 via control line P11 (step 224 of FIG. 7). The memory device 122 of the micro-controller 120 has stored therein the identification of the respective component corresponding to each of the lines D1, D2, D3, D4, D5, D6, and D7 of the first bus interface driver 124. The micro-controller 120 determines the identification of a component that is not properly connected to the wiring harness 12 depending on which of the lines D1, D2, D3, D4, D5, D6, and D7 of the first bus interface driver 124 has 0 Volts thereon.

Referring to FIGS. 5 and 6, such identification data is converted to text in ASCII format by the micro-controller and then sent to the RS232 driver 170 which converts the voltage level of the micro-controller to a standard RS232 voltage level. Such text in ASCII format with identification of any component that is not properly connected to the wiring harness 12 is displayed on the GUI (graphical user interface) screen 176 or printed on the printer 178 (step 226 of FIG. 7). The operator, upon such notification of the identification of any component that is not properly connected to the wiring harness 12, may take measures to properly re-connect such a component.

Referring to FIG. 7, after the micro-controller 120 tests the components assigned to the first bus interface driver 124, the micro-controller determines whether all of the components assigned to the first, second, and third bus interface drivers 124, 126, and 128 have been tested (step 228 of FIG. 7). In this case, since only the components assigned to the first bus interface driver 124 have been tested, the micro-controller 120 determines the next set of components to be tested for proper connectivity to the wiring harness 12 (step 230 of FIG. 7).

For example, the micro-controller 120 applies +5 Volts on the control line P8 and 0 Volts on the control line P9 to select the set of engine components assigned to be coupled to the second bus interface driver 126. Application of +5 Volts on the control line P8 and 0 Volts on the control line P9 causes the 2-to-4 decoder 130 to enable the signals on the eight lines D0, D1, D2, D3, D4, D5, D6, and D7 from the second bus interface driver 126 to be gated to the eight input lines P0, P1, P2, P3, P4, P5, P6, and P7 of the micro-controller 120 while disabling the first and third bus interface drivers 124 and 128.

The micro-controller 120 then repeats the steps 218, 220, 222, 224, 226, 228, and/or 230 for verifying proper connectivity of the set of components assigned to be coupled to the second bus interface driver 126. Thus, the micro-controller 120 applies +5 Volts on the control line P14 to turn on the first opto-isolator device 132 to couple the +5 Volt DC (direct current) power supply 136 to each of the respective harness node to be connected to the respective first component node of the set of engine components assigned to the second bus interface driver 126 (step 218 of FIG. 7).

For example, referring to FIG. 1, assume that the second component node 40 of the linear solenoid 18 is to be coupled to one of the lines D0, D1, D2, D3, D4, D5, D6, and D7 of the second bus interface driver 126 via the respective harness node 42. The first component node 36 of the linear solenoid 18 is to be coupled to the +5 Volt DC (direct current) power supply 136 via the respective harness node 38 when the micro-controller 120 turns on the first opto-isolator device 132.

If an engine component coupled to one of the lines D0, D1, D2, D3, D4, D5, D6, and D7 of the second bus interface driver 126 is properly connected to the wiring harness 12, the +5 V test voltage signal travels through such a component, and a first voltage level of +5 V appears on one of the lines D0, D1, D2, D3, D4, D5, D6, and D7 of the second bus interface driver 126 coupled to such a component. For example, referring to FIG. 1, if the first component node 36 of the linear solenoid 18 is properly connected to the respective harness node 38 and if the second component node 40 is properly connected to the respective harness node 42, when the +5 Volt DC (direct current) power supply 136 is coupled to the first component node 36 of the linear solenoid 18 via the respective harness node 38, the first voltage level of +5 Volts appears on the respective harness node 42 via the second component node 40 of the linear solenoid 18. In that case, one of the lines D0, D1, D2, D3, D4, D5, D6, and D7 of the second bus interface driver 126 coupled to the second component node 40 of the linear solenoid 18 has the first voltage level of +5 Volts thereon.

On the other hand, if a component is not properly connected to the wiring harness 12, then a second voltage level of 0 Volts appears on one of the lines D0, D1, D2, D3, D4, DS, D6, and D7 of the second bus interface driver 126 coupled to such a component. For example, referring to FIG. 1, if the first component node 36 of the linear solenoid 18 is not properly connected to the respective harness node 38 or if the second component node 40 of the linear solenoid 18 is not properly connected to the respective harness node 42, when the +5 Volt DC (direct current) power supply 136 is coupled to the respective harness node 38, the second voltage level of 0 Volts appears on the respective harness node 42. In that case, one of the lines D0, D1, D2, D3, D4, DS, D6, and D7 of the second bus interface driver 18 coupled to the respective harness node 42 has the second voltage level of 0 Volts thereon.

The micro-controller 120 inputs the respective resulting voltage level on each of the lines D0, D1, D2, D3, D4, D5, D6, and D7 of the second bus interface driver 126 to determine whether each of the set of engine components assigned to the second bus interface driver 124 has been properly connected to the wiring harness 12 (step 220 of FIG. 7). If the voltage on each of the lines D0, D1, D2, D3, D4, D5, D6, and D7 of the second bus interface driver 126 is at the first voltage level of +5 Volts, the micro-controller 120 determines that each of the set of engine components assigned to the second bus interface driver 126 has been properly connected to the wiring harness 12.

On the other hand, if the voltage on any of the lines D0, D1, D2, D3, D4, D5, D6, and D7 of the second bus interface driver 126 is at the second voltage level of 0 Volts, the micro-controller 120 determines that a component of the set of engine components assigned to be coupled to the second bus interface driver 126 has not been properly connected to the wiring harness 12. In that case, the micro-controller 120 applies +5 Volts on the control line P15 to turn on the NG LED 108 and to turn on the audible alarm 156 for about 5 seconds (step 222 of FIG. 7). Such visual and audible alarms provide a warning signal to the operator that a component of the plurality of components is not properly connected to the wiring harness 12.

In addition, the micro-controller 120 determines and outputs data including the identification of the component that is not properly connected to the wiring harness 12 via control line P11 (step 224 of FIG. 7). The memory device 122 of the micro-controller 120 has stored therein the identification of the respective component corresponding to each of the lines D0, D1, D2, D3, D4, D5, D6, and D7 of the second bus interface driver 126. The micro-controller 120 determines the identification of a component that is not properly connected to the wiring harness 12 depending on which of the lines D0, D1, D2, D3, D4, D5, D6, and D7 of the second bus interface driver 126 has 0 Volts thereon.

Referring to FIGS. 5 and 6, such identification data is converted to text in ASCII format by the micro-controller and then sent to the RS232 driver 170 which converts the voltage level from the micro-controller to a standard RS232 voltage level. Such text in ASCII format with identification of any component that is not properly connected to the wiring harness 12 is displayed on the GUI (graphical user interface) screen 176 or printed on the printer 178 (step 226 of FIG. 7). The operator, upon such notification of the identification of any component that is not properly connected to the wiring harness 12, may take measures to properly re-connect such a component.

Referring to FIG. 7, after the micro-controller 120 determines whether each of the components assigned to the second bus interface driver 126 is properly connected to the wiring harness 12, the micro-controller determines whether all of the components assigned to the first, second, and third bus interface drivers 124, 126, and 128 have been tested (step 228 of FIG. 7). In this case, since only the components assigned to the first and second bus interface drivers 124 and 126 have been tested, the micro-controller 120 determines the next set of components to be tested for proper connectivity to the wiring harness 12 (step 230 of FIG. 7).

For example, the micro-controller 120 applies +5 Volts on the control line P8 and +5 Volts on the control line P9 to select the set of engine components assigned to be coupled to the third bus interface driver 128. Application of +5 Volts on the control line P8 and +5 Volts on the control line P9 causes the 2-to-4 decoder 130 to enable the signals on the eight lines D0, D1, D2, D3, D4, D5, D6, and D7 from the third bus interface driver 128 to be gated to the eight input lines P0, P1, P2, P3, P4, P5, P6, and P7 of the micro-controller 120 while disabling the first and second bus interface drivers 124 and 126.

The micro-controller 120 then repeats the steps 218, 220, 222, 224, 226, 228, and/or 230 for verifying proper connectivity of the set of components assigned to the third bus interface driver 128. Thus, the micro-controller 120 applies +5 Volts on the control line P14 to turn on the first opto-isolator device 132 to couple the +5 Volt DC (direct current) power supply 136 to each of the respective harness node to be connected to the respective first component node of the set of engine components assigned to the third bus interface driver 128 (step 218 of FIG. 7).

As described for the first and second bus interface drivers 124 and 126, if an engine component coupled to the lines D0, D1, D2, D3, D4, D5, D6, and D7 of the third bus interface driver 128 is properly connected to the wiring harness 12, the +5 V test voltage signal travels through such a component, and a first voltage level of +5 V appears on one of the lines D0, D1, D2, D3, D4, DS, D6, and D7 of the third bus interface driver 128 coupled to such a component. On the other hand, if a component is not properly connected to the wiring harness 12, then a second voltage level of 0 Volts appears on one of the lines D0, D1, D2, D3, D4, D5, D6, and D7 of the third bus interface driver 128 coupled to such a component.

The micro-controller 120 inputs the respective resulting voltage level on each of the lines D0, D1, D2, D3, D4, D5, D6, and D7 of the third bus interface driver 128 to determine whether each of the set of engine components assigned to the third bus interface driver 128 has been properly connected to the wiring harness 12 (step 220 of FIG. 7). If the voltage on each of the lines D0, D1, D2, D3, D4, D5, D6, and D7 of the third bus interface driver 128 is at the first voltage level of +5 Volts, the micro-controller 120 determines that each of the set of engine components assigned to the third bus interface driver 128 has been properly connected to the wiring harness 12.

On the other hand, if the voltage on any of the lines D0, D1, D2, D3, D4, D5, D6, and D7 of the third bus interface driver 128 is at the second voltage level of 0 Volts, the micro-controller 120 determines that a component of the set of engine components assigned to be coupled to the third bus interface driver 128 has not been properly connected to the wiring harness 12. In that case, the micro-controller 120 applies +5 Volts on the control line P15 to turn on the NG LED 108 and to turn on the audible alarm 156 for about 5 seconds (step 222 of FIG. 7). Such visual and audible alarms provide a warning signal to the operator that a component of the plurality of components is not properly connected to the wiring harness 12.

In addition, the micro-controller 120 determines and outputs data including the identification of the component that is not properly connected to the wiring harness 12 via control line P11 (step 224 of FIG. 7). The memory device 122 of the micro-controller 120 has stored therein the identification of the respective component corresponding to each of the lines D0, D1, D2, D3, D4, D5, D6, and D7 of the third bus interface driver 128. The micro-controller 120 determines the identification of a component that is not properly connected to the wiring harness 12 depending on which of the lines D0, D1, D2, D3, D4, D5, D6, and D7 of the third bus interface driver 128 has 0 Volts thereon.

Referring to FIGS. 5 and 6, such identification data is converted to text in ASCII format by the micro-controller and then sent to the RS232 driver 170 which converts the voltage level of the micro-controller to a standard RS232 voltage level. Such text in ASCII format with identification of any component that is not properly connected to the wiring harness 12 is displayed on the GUI (graphical user interface) screen 176 or printed on the printer 178 (step 226 of FIG. 7). The operator, upon such notification of the identification of any component that is not properly connected to the wiring harness 12, may take measures to properly re-connect such a component.

Referring to FIG. 7, after the micro-controller 120 determines whether each of the components assigned to the third bus interface driver 128 is properly connected to the wiring harness 12, the micro-controller determines whether all of the components assigned to the first, second, and third bus interface drivers 124, 126, and 128 have been tested (step 228 of FIG. 7). In this case, all of the components assigned to be coupled to the first, second, and third bus interface drivers 124, 126, and 128 have been tested.

The micro-controller 120 then determines whether any NG alarms have been emitted (step 232 of FIG. 7). If a NG alarm has not been generated after testing all of the components assigned to the first, second, and third bus interface drivers 124, 126, and 128, the micro-controller 120 determines that all of the plurality of components are properly connected to the wiring harness 12. In that case, the micro-controller 120 applies +5 Volts on the control line P12 to turn on the OK LED 110 to provide an approval signal for about 5 seconds (step 234 of FIG. 7). Such an approval signal indicates that all of the plurality of components are properly connected to the wiring harness 12.

In any case, after all of the plurality of components assigned to the first, second, and third bus interface drivers 124, 126, and 128 have been tested, the micro-controller 120 returns to step 202 to monitor for when the start button 106 is depressed to begin testing proper connectivity for another wiring harness of another vehicle engine. The micro-controller 120 loops around step 202 until the operator depresses the start button 106 to indicate to the micro-controller 120 that another wiring harness has been plugged into the testing harness connector 104 such that verification of proper connectivity of a plurality of engine components may begin for this next wiring harness.

In this manner, the assembly line testing apparatus 100 of the present invention checks for proper connectivity of a plurality of components to the wiring harness during assembly of the vehicle engine. The assembly line testing apparatus 100 of the present invention does not depend on the vehicle engine running, and thus, the proper connectivity of the plurality of components to the wiring harness may be checked at or near the location for connecting the plurality of components to the wiring harness within the assembly line for manufacture of the vehicle engine before the vehicle engine is completely assembled.

In addition, the micro-controller 120 determines whether a test voltage signal is returned through a component within a closed circuit loop for electrically verifying whether the component is properly connected to the wiring harness. Thus, visual inspection of the connection of the component to the wiring harness is not necessary.

The foregoing is by way of example only and is not intended to be limiting. For example, the present invention is described for determining whether each of a plurality of engine components are properly connected to a wiring harness during manufacture of a vehicle engine. However, the present invention may be used for determining whether a plurality of components are properly connected to a wiring harness during manufacture of any type of article of manufacture, as would be apparent to one of ordinary skill in the art from the description herein.

In addition, the appearance of the wiring harness 12 and the wiring harness connector 104 as an array of electrically conductive nodes in FIGS. 1, 3, 4, 5, and 6 is by way of example only for clarity of illustration and description. A wiring harness typically has more numerous electrically conductive nodes than illustrated in FIGS. 1, 3, 4, and 5, but fewer conductive nodes with the three 8-line bus interface drivers 124, 126, and 128 are illustrated in FIG. 1, 3, 4, and 5 for clarity of illustration and description. In addition, more numerous engine components are coupled to the wiring harness within a vehicle engine, but three example components 14, 16, and 18 are shown in FIG. 1 for clarity of illustration and description.

The present invention is limited only as defined in the following claims and equivalents thereof.

I claim:

1. A method for verifying proper connectivity of a plurality of components to a wiring harness within an article of manufacture, each component having a respective first component node that is to be coupled to a respective first harness node of said wiring harness via a first respective plug coupler and having a respective second component node that is to be coupled to a respective second harness node of said wiring harness via a second respective plug coupler, the method including the steps of:

A. controlling, by a micro-controller, application of a test voltage signal at said respective first harness node of said wiring harness;

wherein said first and second respective harness nodes are each a separate and electrically discoupled node from each-other before said component is coupled between said first and second respective harness nodes;

and wherein a distinct separate set of respective first and second harness nodes are for being coupled to respective first and second component nodes of each of said plurality of components;

B. detecting and inputting by said micro-controller a resulting voltage signal at said respective second harness node of said wiring harness after application of said test voltage signal at said respective first harness node, wherein said resulting voltage signal is at a first voltage level if said respective first component node is properly connected to said respective first harness node of said wiring harness via said first respective plug coupler and if said respective second component node is properly connected to said respective second harness node of said wiring harness via said second respective plug coupler;

and wherein said resulting voltage signal is at a second voltage level if said respective first component node is not properly connected to said respective first harness node of said wiring harness via said first respective plug coupler or if said respective second component node is not properly connected to said respective second harness node of said wiring harness via said second respective plug coupler;

and wherein said resulting voltage signal is detected by said micro-controller at said respective second harness node that is a distinct separate one of the harness nodes of said wiring harness for each of said plurality of components;

C. determining by said micro-controller that a component is properly connected to said wiring harness if said resulting voltage signal is at said first voltage level, and determining by said micro-controller that said component is not properly connected to said wiring harness if said resulting voltage signal is at said second voltage level; and D. repeating said steps A, B, and C for each of said plurality of components coupled to said wiring harness.

2. The method of claim 1, wherein said article of manufacture is a vehicle engine, and wherein said plurality of components includes a knock sensor, and wherein said test voltage signal is an AC (alternating current) signal generated by an oscillator tuned to generate said AC signal with a resonance frequency of said knock sensor.

3. The method of claim 1, wherein said article of manufacture is a vehicle engine, wherein said test voltage signal is a DC (direct current) signal of +5 Volts, wherein said first voltage level is +5 Volts, and wherein said second voltage level is 0 Volts.

4. The method of claim 1, further including the step of:
generating a warning signal when said micro-controller determines that any of said plurality of components is not properly connected to said wiring harness.

5. The method of claim 4, wherein said warning signal includes a visual alarm and an audible alarm.

6. The method of claim 1, further including the step of:
generating an approval signal when said micro-controller determines that all of said plurality of components is properly connected to said wiring harness.

7. The method of claim 1, further including the steps of:
determining by said micro-controller an identification of any of said plurality of components that is not properly connected to said wiring harness as indicated by which harness node of said wiring harness has said second voltage level as said resulting voltage level; and
displaying said identification of any of said plurality of components that is not properly connected to said wiring harness.

8. The method of claim 7, further including the step of:
displaying said identification of any of said plurality of components that is not properly connected to said wiring harness on a GUI (graphical user interface) screen.

9. The method of claim 7, further including the step of:
displaying said identification of any of said plurality of components that is not properly connected to said wiring harness on a printer.

10. The method of claim 1, further including the step of:
pressing a start button by an operator to indicate to the micro-controller that said operator has coupled said wiring harness to said micro-controller such that verification of proper connectivity of said plurality of components to said wiring harness may begin.

11. An assembly line testing apparatus for verifying proper connectivity of a plurality of components to a wiring harness within an article of manufacture, each component having a respective first component node that is to be coupled to a respective first harness node of said wiring harness via a first respective plug coupler and having a respective second component node that is to be coupled to a respective second harness node of said wiring harness via a second respective plug coupler, the assembly line testing apparatus comprising:

a testing harness connector for coupling said assembly line testing apparatus to each harness node of said wiring harness;

a test voltage signal generator coupled via said testing harness connector to said respective first harness node for generating a test voltage signal to be applied at said respective first harness node of said wiring harness for a component;

wherein said test voltage signal generator is coupled via said testing harness connector to said respective first harness node that is a separate and electrically discoupled node from said respective second harness node before said component is coupled between said first and second respective harness nodes;

and wherein a distinct separate set of respective first and second harness nodes are coupled to respective first and second component nodes for each of said plurality of components; and a micro-controller coupled via said testing harness connector to said respective second harness node for said component for detecting and inputting by said micro-controller a respective resulting voltage signal at said respective second harness node of said wiring harness for said component after application of said test voltage signal at said respective first harness node for said component;

wherein said micro-controller is coupled via said testing harness connector to said respective second harness node that is a separate and electrically discoupled node from said respective first harness node before said component is coupled between said first and second respective harness nodes;

and wherein said micro-controller is coupled via said testing harness connector to said respective second harness node that is a distinct separate one of the harness nodes of said wiring harness for each of said plurality of components;

and wherein said respective resulting voltage signal is at a first voltage level if said respective first component node is properly connected to said respective first harness node of said wiring harness via said first respective plug coupler and if said respective second component node is properly connected to said respective second harness node of said wiring harness via said second respective plug coupler;

and wherein said resulting voltage signal is at a second voltage level if said respective first component node is not properly connected to said respective first harness node of said wiring harness via said first respective plug coupler or if said respective second component node is not properly connected to said respective second harness node of said wiring harness via said second respective plug coupler;

and wherein said micro-controller includes a memory device having sequences of instructions stored thereon, and wherein execution of said sequences of instructions by said micro-controller causes said micro-controller to perform the steps of:

A. controlling application of said test voltage signal from said test voltage signal generator to said respective first harness node for a component;

B. determining that said component is properly connected to said wiring harness if said resulting voltage signal at said respective second harness node for said component is at said first voltage level;

C. determining by said micro-controller that said component is not properly connected to said wiring harness if said resulting voltage signal at said respective second harness node is at said second voltage level; and D. repeating said steps A, B, and C for each of said plurality of components.

12. The assembly line testing apparatus of claim 11, wherein said article of manufacture is a vehicle engine, and wherein said plurality of components includes a knock sensor, and wherein said assembly line testing apparatus further includes:

an oscillator for generating said test voltage signal to be applied on said respective first harness node coupled to said respective first component node of said knock sensor, wherein said oscillator is tuned to generate said test voltage signal as an AC (alternating current) signal with a resonance frequency of said knock sensor.

13. The assembly line testing apparatus of claim 11, wherein said article of manufacture is a vehicle engine, wherein said test voltage signal is a DC (direct current) signal of +5 Volts, wherein said first voltage level is +5 Volts, and wherein said second voltage level is 0 Volts.

14. The assembly line testing apparatus of claim 11, further comprising:

a warning alarm for generating a warning signal when said micro-controller determines that any of said plurality of components is not properly connected to said wiring harness.

15. The assembly line testing apparatus of claim 14, wherein said warning signal includes a visual alarm and an audible alarm.

16. The assembly line testing apparatus of claim 11, further comprising:

a LED (light emitting diode) for generating an approval signal when said micro-controller determines that all of said plurality of components is properly connected to said wiring harness.

17. The assembly line testing apparatus of claim 11, wherein execution of said sequences of instructions by said micro-controller causes said micro-controller to perform the further steps of:

determining an identification of any of said plurality of components that is not properly connected to said wiring harness as indicated by which harness node of said wiring harness has said second voltage level as said resulting voltage level; and displaying said identification of any of said plurality of components that is not properly connected to said wiring harness.

18. The assembly line testing apparatus of claim 17, further comprising:

a GUI (graphical user interface) screen for displaying said identification of any of said plurality of components that is not properly connected to said wiring harness.

19. The assembly line testing apparatus of claim 17, further comprising:

a printer for displaying said identification of any of said plurality of components that is not properly connected to said wiring harness.

20. The assembly line testing apparatus of claim 11, further comprising:

a start button coupled to said micro-controller, wherein said start button is pressed by an operator to indicate to the micro-controller that said operator has coupled said testing harness connector to said wiring harness such that verification of proper connectivity of said plurality of components to said wiring harness may begin.

21. An assembly line testing apparatus for verifying proper connectivity of a plurality of components to a wiring harness within an article of manufacture, each component having a respective first component node that is to be coupled to a respective first harness node of said wiring harness via a first respective plug coupler and having a respective second component node that is to be coupled to a respective second harness node of said wiring harness via a second respective plug coupler, the assembly line testing apparatus comprising:

a testing harness connector for coupling said assembly line testing apparatus to each harness node of said wiring harness;

means for generating a test voltage signal to be applied, via said testing harness connector, to said respective first harness node of said wiring harness for a component;

wherein said means for generating said test voltage signal is coupled to said respective first harness node that is a separate and electrically discoupled node from said respective second harness node before said component is coupled to between said first and second respective harness nodes;

and wherein a distinct separate set of respective first and second harness nodes are coupled to respective first and second component nodes of each of said plurality of components;

means for detecting, via said testing harness connector, a respective resulting voltage signal at said respective second harness node of said wiring harness for said component after application of said test voltage signal at said respective first harness node for said component;

wherein said means for detecting is coupled to said respective second harness node that is a separate and electrically discoupled node from said respective first harness node before said component is coupled between said first and second respective harness nodes;

and wherein said means for detecting is coupled to said respective second harness node that is a distinct separate one of the harness nodes of said wiring harness for each of said plurality of components;

and wherein said respective resulting voltage signal is at a first voltage level if said respective first component node is properly connected to said respective first harness node of said wiring harness via said first respective plug coupler and if said respective second component node is properly connected to said respective second harness node of said wiring harness via said second respective plug coupler;

and wherein said resulting voltage signal is at a second voltage level if said respective first component node is not properly connected to said respective first harness node of said wiring harness via said first respective plug coupler or if said respective second component node is not properly connected to said respective second harness node of said wiring harness via said second respective plug coupler;

means for determining that said component is properly connected to said wiring harness if said resulting voltage signal at said respective second harness node is at said first voltage level, and for determining that said component is not properly connected to said wiring harness if said resulting voltage signal at said respective second harness node is at said second voltage level; and means for repeating the determination of whether a component is properly connected to said wiring harness for each of said plurality of components.

22. The assembly line testing apparatus of claim 21, wherein said article of manufacture is a vehicle engine, and wherein said plurality of components includes a knock sensor, and wherein said assembly line testing apparatus further includes:

means for generating said test voltage signal to be applied on said respective first harness node coupled to said respective first component node of said knock sensor, wherein said test voltage signal is an AC (alternating current) signal with a resonance frequency of said knock sensor.

23. The assembly line testing apparatus of claim 21, wherein said article of manufacture is a vehicle engine, wherein said test voltage signal is a DC (direct current) signal of +5 Volts, wherein said first voltage level is +5 Volts, and wherein said second voltage level is 0 Volts.

24. The assembly line testing apparatus of claim 21, further comprising:

means for generating a warning signal when said microcontroller determines that any of said plurality of components is not properly connected to said wiring harness.

25. The assembly line testing apparatus of claim 21, further comprising:

means for generating an approval signal when said microcontroller determines that all of said plurality of components is properly connected to said wiring harness.

26. The assembly line testing apparatus of claim 21, further comprising:

means for determining an identification of any of said plurality of components that is not properly connected to said wiring harness; and means for displaying said identification of any of said plurality of components that is not properly connected to said wiring harness.

27. The assembly line testing apparatus of claim 21, further comprising:

means for indicating to said assembly line testing apparatus that an operator has coupled said testing harness connector to said wiring harness such that verification of proper connectivity of said plurality of components to said wiring harness may begin.

* * * * *